United States Patent [19]

Mitchell et al.

[11] Patent Number: 4,596,039

[45] Date of Patent: Jun. 17, 1986

[54] METHOD FOR CONVERTING AN IMAGE FROM A RUN END OR RUN LENGTH REPRESENTATION TO A BIT MAP

[75] Inventors: Joan L. Mitchell, Ossining; Karen L. Anderson, Peekskill, both of N.Y.

[73] Assignee: International Business Machines Corporation, Armonk, N.Y.

[21] Appl. No.: 567,292

[22] Filed: Dec. 30, 1983

[51] Int. Cl.$^4$ .............................................. G06K 9/36
[52] U.S. Cl. ..................................... 382/56; 358/260; 358/261
[58] Field of Search .................. 382/56; 358/260, 261, 358/262; 340/703, 750

[56] References Cited

U.S. PATENT DOCUMENTS 4,152,697  5/1979  Rider et al. .......................... 358/261
4,207,599  6/1980  Murayama et al. .................. 358/261
4,233,601  11/1980 Hankins et al. ...................... 340/703
4,327,379  4/1982  Kadakia et al. ...................... 358/261

Primary Examiner—Leo H. Boudreau
Assistant Examiner—Jacqueline Todd
Attorney, Agent, or Firm—George E. Clark; Thomas P. Dowd

[57] ABSTRACT

A method for converting an image from a run representation to a bit map, includes the steps of: storing a plurality of run representations of an image in a buffer; initializing a line of data; converting, by table lookup, each run representation, in said line, to a picture element representation, storing said picture element representation of said line; repeating the steps of initializing, converting and storing for remaining run representations until said image has been converted to a bit map representation.

20 Claims, 8 Drawing Figures

Variables for Conversion Algorithm

W is the size of a storage element, in bytes
Subscripted W and B values indicate white and black run ends
BUFLEN = W * ((2 * K) + 6)
$W_K = B_K$ if the last run in the line is white NCOL, LFTPAD, RTPAD, and XSKIP are specified in bits Lookup Tables

| (index) | 0 | 1 | 2 | 3 | 4 | 5 | 6 | 7 |
|---|---|---|---|---|---|---|---|---|
| SBLAK | FF | 7F | 3F | 1F | 0F | 07 | 03 | 01 |
| EBLAK | 00 | 80 | C0 | E0 | F0 | F8 | FC | FE |

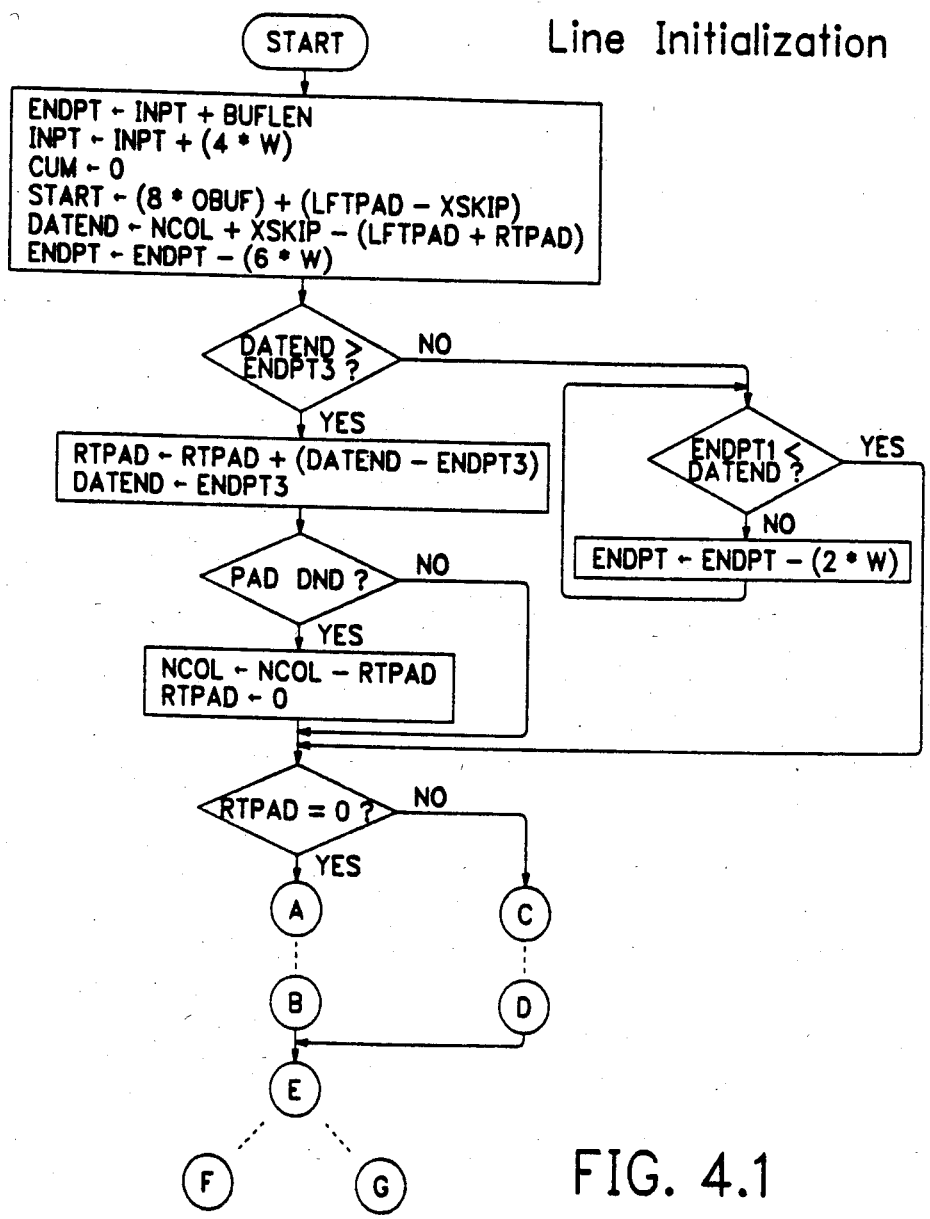
FIG. 4.1

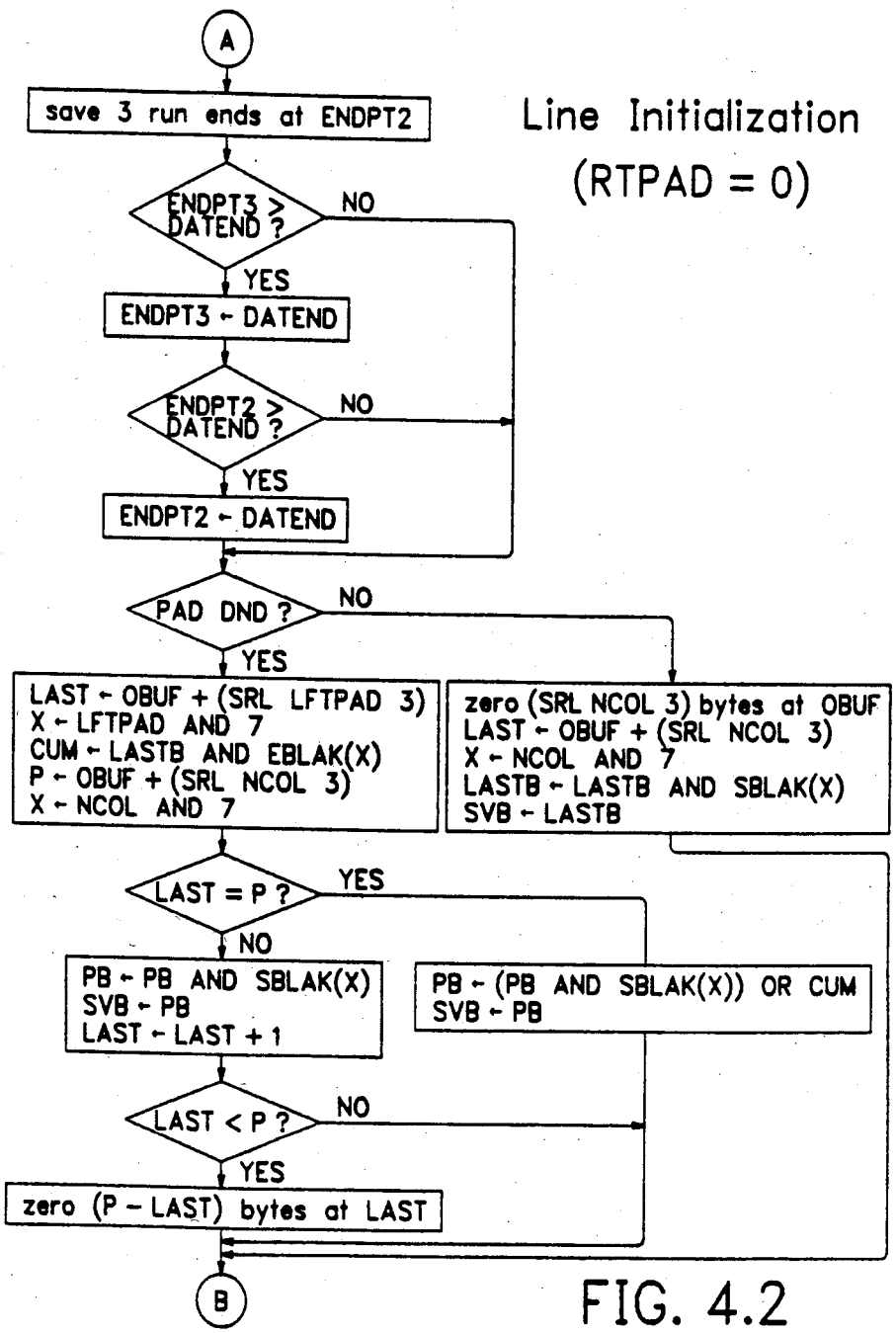
FIG. 4.2 — Line Initialization (RTPAD = 0)

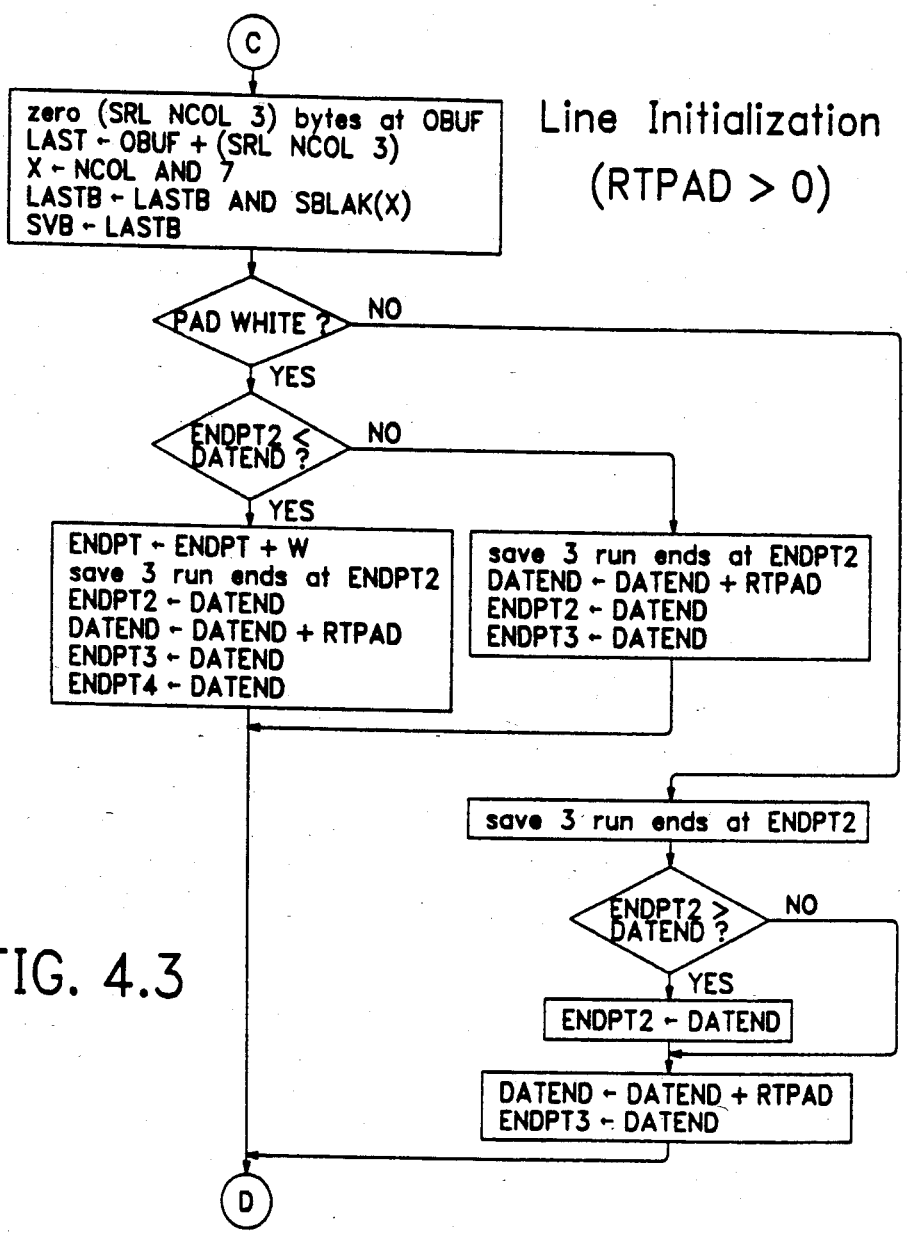
FIG. 4.3

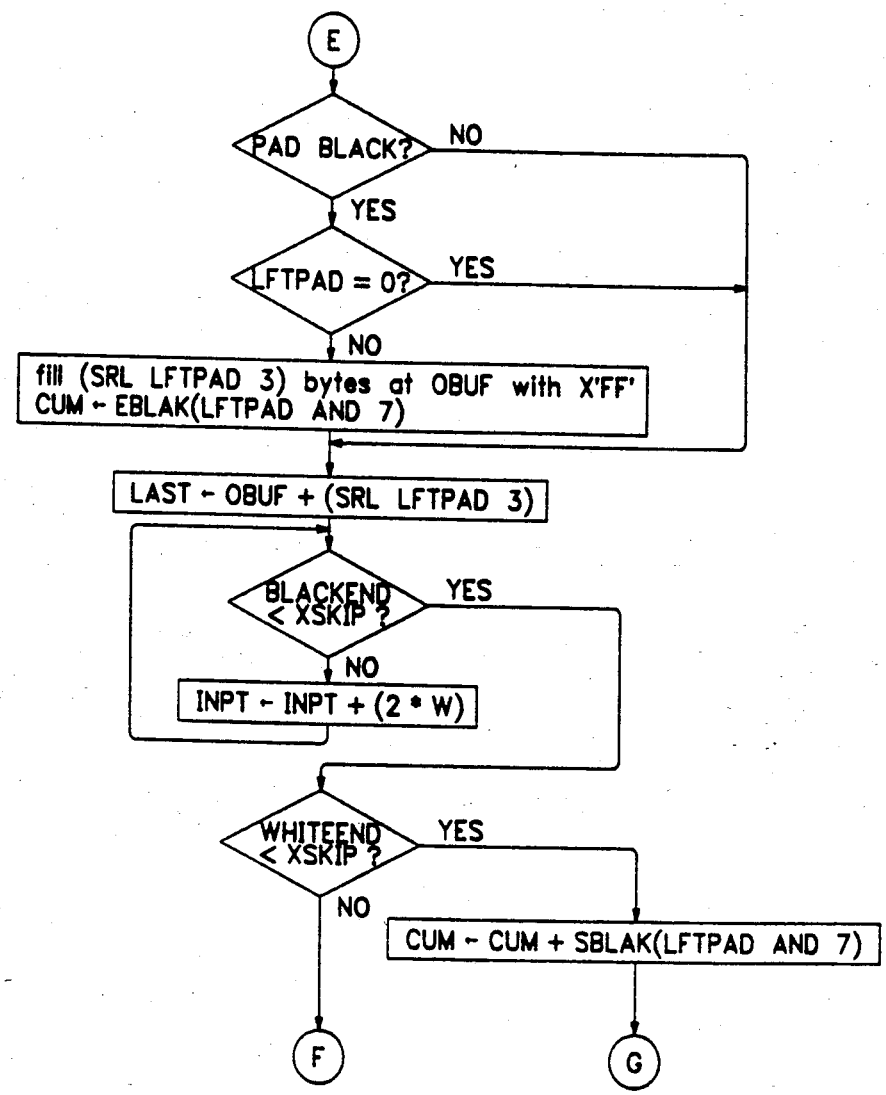
FIG. 4.4

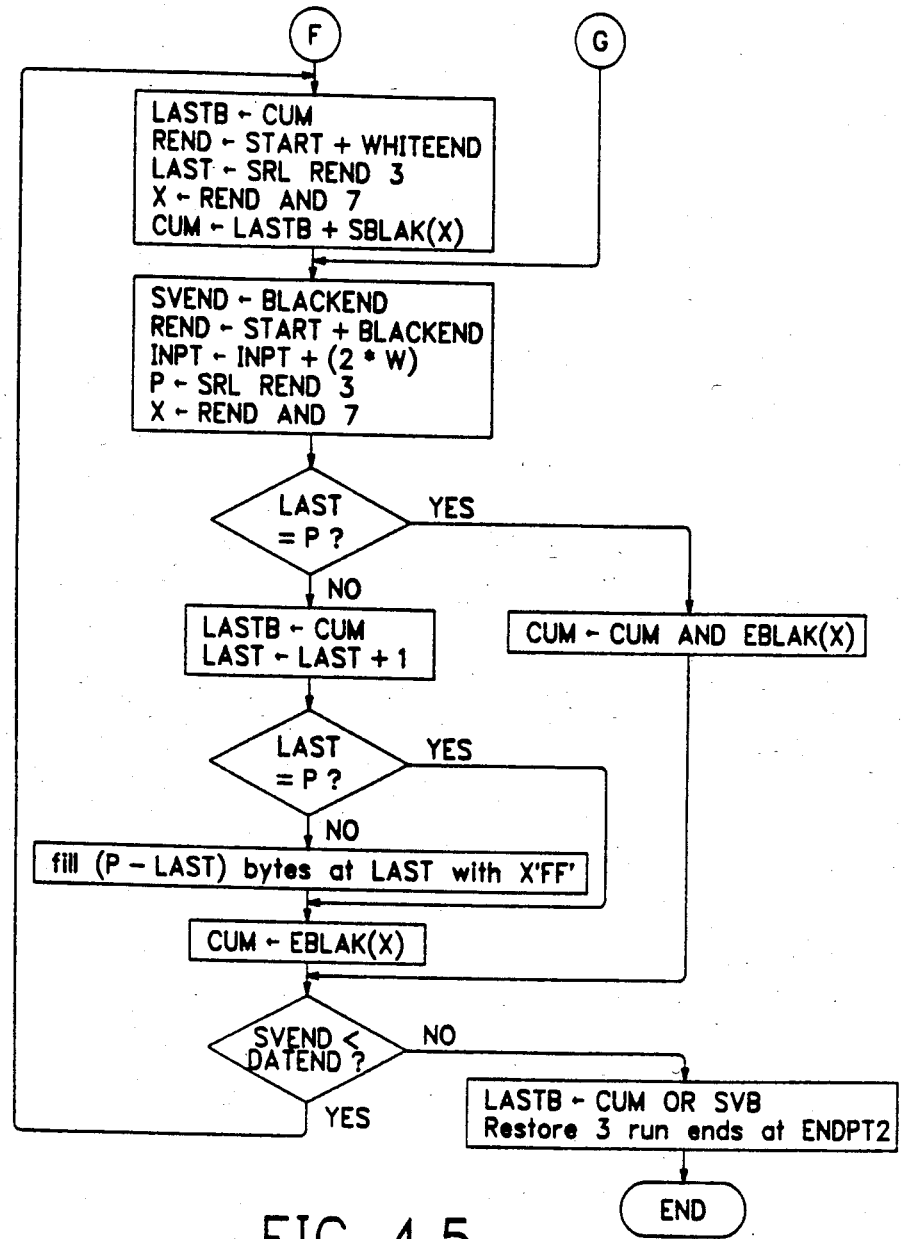
FIG. 4.5

METHOD FOR CONVERTING AN IMAGE FROM A RUN END OR RUN LENGTH REPRESENTATION TO A BIT MAP

BACKGROUND OF THE INVENTION

1. Field of the Invention

The present invention relates to digital image processing methods and more particularly to methods for converting an image from a run end or run length representation to a bit map.

2. Description of the Prior Art

Although there are many image manipulation methods in the prior art, none is known which teaches or suggests the method of the present invention.

SUMMARY OF THE INVENTION

Therefore, it is an object of the present invention to convert an image from a run representation to a bit map, by a method including the steps of: storing a plurality of run representations of an image in a buffer; initializing a line of data; converting each run representation, in said line, to a picture element representation, storing said picture element representation of said line; repeating the steps of initializing, converting and storing for remaining run representations until said image has been converted to a bit map representation.

Accordingly, an image is converted from a run representation to a bit map, by a method including the steps of: storing a plurality of run representations of an image in a buffer; initializing a line of data; converting, by table lookup, each run representation, in said line, to a picture element representation, storing said picture element representation of said line; repeating the steps of initializing, converting and storing for remaining run representations until said image has been converted to a bit map representation.

The foregoing and other objects, features and advantages of the invention will be apparent from the more particular description of the preferred embodiments of the invention, as illustrated in the accompanying drawing.

BRIEF DESCRIPTION OF THE DRAWING

FIGS. 4.1, 4.2, 4.3, 4.4 and 4.5 is a flow chart of line initialization and pel data generation in accordance with the method of the present invention.

In the drawing, like elements are designated with similar reference numbers, and identical elements in different specific embodiments are designated by identical reference numbers.

DESCRIPTION OF A PREFERRED EMBODIMENT OF THE INVENTION

Figure 1:
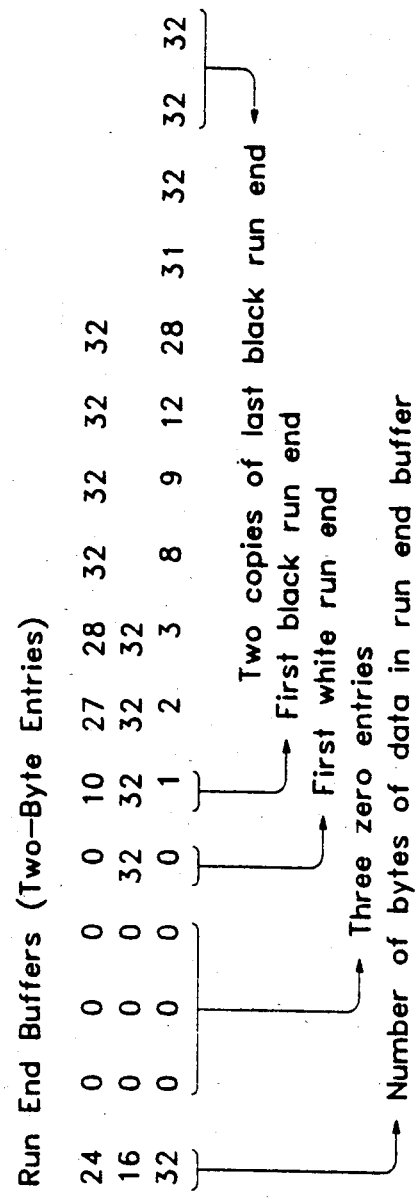
FIG. 1 is a chart showing run end representation of image data in accordance with the present invention.

The problem addressed by the present invention is that of quickly converting a binary image represented as a series of vectors of run ends or run lengths (one vector for each line for image data) into a bit image. A run end is the displacement in bits (i.e. pels) from the left edge of the image to the last pel in a run. A run length is the number of pels in a run. The term "run representation" will be used in the description which follows to include "run length" and "run end".

The present invention uses a combination of techniques to produce code which is significantly faster than current methods. These techniques include:

1. Reducing the number of tests to see if the end of a line has been reached by performing an appropriate modification of the input data and then processing the runs in pairs so that the test is only done once per pair of runs rather than once per run;
2. Eliminating the testing and truncation within the inner loop of the last run in a line in the case where the run end/run length buffer describes a longer line than that desired for the output image, by modifying the input data in such a way as to ensure that there is a run end of the appropriate color exactly at the edge of the image.
3. Eliminating the need to test for the end of the input data within the inner loop, by ensuring that no attempt is made to convert a line longer than that described in the run end/run length buffer.
4. Exploiting the fact that a binary image typically includes large areas containing only zero (white) picture elements, by taking advantage of special instructions available on many processors to fill a large area with white bytes (or with black bytes if a long black run is encountered); and
5. Using a fast table lookup procedure to fill in black bits within a byte.

The method is structured so that data on either or both edges of the coded input image may be ignored if desired, and either or both edges of the output image may be padded with pels which are either black or white, or are taken from the location where the output image is to be stored (permitting insertion of a converted image which is not on byte boundaries into a larger image). This method has general application.

This method may be used to generate an image from either run ends or run lengths. The description which follows will assume that run ends are supplied. To convert run lengths, a cumulative total of the run lengths processed would be kept.

The bits making up the reconstructed image are assumed to be stored packed eight to a byte, with each line beginning and ending on a byte boundary. The lines are to be arranged sequentially in storage. Since it is possible to convert the image as if it were padded on either the right and/or left edges with either zero or one bits or with the data which already exists in the output image, the reconstructed image actually does not have to start or stop on byte boundaries. It is also possible to skip coded data representing pels at the beginning and/or end of the line by appropriate initializations.

Referring to FIG. 1, the structure of the run representation of image data will be described. A preferred embodiment uses a run end buffer for each line which contains a series of halfwords. The 16 bits in the halfword are adequate to represent images with widths up to 32K as positive displacements. The first halfword in each line buffer gives the number of bytes of run end data plus two bytes for the count (i.e. the total number of bytes of data in the buffer); this is followed by three zero run ends, an arbitrary number of pairs of white/black run ends, and two additional copies of the last black run end. If the image row begins with a black run, the first white run end must be specified as zero. If the image row ends with a white run, the last black run end will be the same as the last white run end, so that we in fact have three copies of the last real run end. For example, if no skipping or padding is specified, and an output size of three lines of 32 pels each is specified, then the run end buffer containing the halfword entries

| 24 | 0 | 0 | 0 | 0  | 10 | 27 | 28 | 32 | 32 | 32 | 32 | 32 |    |    |
|----|---|---|---|----|----|----|----|----|----|----|----|----|----|----|
| 16 | 0 | 0 | 0 | 32 | 32 | 32 | 32 |    |    |    |    |    |    |    |
| 32 | 0 | 0 | 0 | 0  | 1  | 2  | 3  | 8  | 9  | 12 | 28 | 31 | 32 | 32 32 | would correspond to the following bit image:

| 11111111 | 11000000 | 00000000 | 00010000 |
| 00000000 | 00000000 | 00000000 | 00000000 |
| 10100000 | 10001111 | 11111111 | 11110001 |

Our implementation assumes that run end buffers for successive lines of image data are stored sequentially, with no intervening space.

The procedure for converting a run end representation of a line of image data may be summarized as follows.

1. The run end buffer is modified so that it describes a line which includes the padding pels on the right edge and which has a black run end at the end of the data which is to be converted. This will involve truncation of the input line if the run end buffer describes a line which is longer than the line to be converted; if there is not enough data in the run end buffer to convert the number of pels needed, the number of pels to be converted is reduced to the number of pels available and the difference is made up by padding on the right edge.
2. The area where the output line is to be constructed is cleared.
3. The value of the byte which will contain the first bit beyond the end of the reconstructed image line is masked to clear any bits which will be filled with reconstructed image data and then saved.
4. The left edge is padded with black bits, if necessary. (Padding with white bits or data from a preexisting output image requires no special processing, since those bits have been cleared in the first case or not disturbed in the second).
5. If coded data is to be skipped on the left edge, we step through the run end buffer until we find a run end which reaches into the data we want to convert. If the run end is that of a white run, we proceed to the top of the inner loop; if it is that of a black run, we set all of the non-padding bits in the byte which we are currently constructing to ones and proceed to the part of the inner loop which processes a black run.
6. The inner loop is used to convert pairs of runs, with the first run in each pair being white and the second black.
7. The byte containing the first bit beyond the end of the reconstructed image line is replaced by the logical OR of the value of that byte saved in step 3 with the byte currently being reconstructed. Data from the preexisting output image and the reconstructed row are thus combined appropriately in a single byte if the reconstructed row does not end on a byte boundary.

Figure 2:
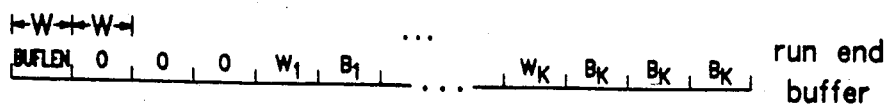
FIG. 2 is a chart showing the conversion formats and variables according to the present invention.
Figure 2:
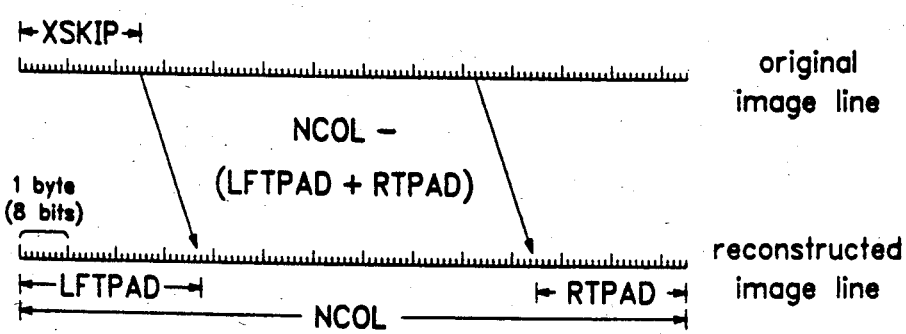

The variables used in the conversion algorithm are listed in Table 1 below; some of them are illustrated in FIG. 2.

TABLE I

Variables for Conversion Algorithm

| | |
|---|---|
| BLACKEND | Black run end currently being processed (at address INPT + W) |
| BUFLEN | first unit in run end buffer; gives number of bytes of data in run end buffer for current line |
| CUM | byte of image data currently being constructed |
| DATEND | number of pels accounted for in output line when all required input pels have been processed |
| EBLAK | lookup table used to clear all bits beyond the first N bits (where N is the index) |
| ENDPT | pointer to the last white run end whose succeeding black run end is less than DATEND. Successive run ends beginning at ENDPT are referred to as ENDPT0, ENDPT1, ENDPT2, ENDPT3, and ENDPT4. |
| INPT | pointer to run end data |
| LAST | pointer to address where current CUM is to be stored |
| LASTB | byte whose address is given by LAST |
| LFTPAD | number of pad bits to be inserted on the left |
| NCOL | number of pels per line in the output image |
| NEXTLN | pointer to run end buffer for next line |
| OBUF | pointer to beginning of current output image row |
| P | temporary pointer variable |
| PB | byte whose address is given by P |
| PADCOLOR | representation of color of padding bits: white, black, or DND ("do not disturb") |
| REND | bit address of a run end in the output image |
| RTPAD | number of pad bits to be inserted on the right |
| SBLAK | lookup table used to set all bits beyond the first N bits to one (where N is the index) |
| START | bit address such that when a run end is added to START, the result will be the bit address of the run end in the output image |
| SVB | storage area where byte containing first bit of output image is stored |
| SVEND | temporary variable to save BLACKEND for later use |
| W | width of an element in the run end buffer, in bytes |
| WHITEEND | White run end currently being processed (at address INPT) |
| WID | width of output image, in bytes |
| X | temporary variable |
| XSKIP | number of bits of image data to be skipped at the beginning of each line |

For the purposes of this discussion, the most important variables are the byte of image data which is currently being constructed (referred to as CUM); the pointer to the run end data (INPT); the pointer to the run end data describing the right edge of the image (ENDPT); the pointer to the location where the output image line is to be stored (OBUF); the number of pels in the trimmed and padded output image line (NCOL); the number of pels which will have been accounted for in the run end buffer when all of the required input data has been processed (DATEND); the bit address such that when a run end is added to the address, the result is the bit address in storage where the run end is to occur (START); the number of bits represented in the run end buffer which are to be omitted from the right edge of the output image (XSKIP); the number of padding bits to be inserted on the left and right (LFTPAD and RTPAD); and the color of the padding bits to be inserted. In the case where the padding bits are to be taken from the preexisting output image, the "color" of the padding bits is referred to as "DND", for "do not disturb". Thus the color of the padding bits may be white, black, or DND. The width of an element of the run end buffer, expressed in bytes, is referred to as W.

The conversion process makes use of two lookup tables, shown as SBLAK and EBLAK in the illustrations. Each of these tables contains eight entries, one for each possible value of the number of leftover bits in a byte. The table entries (in hexadecimal) are:

| (index) | 0  | 1  | 2  | 3  | 4  | 5  | 6  | 7  |
|---------|----|----|----|----|----|----|----|----|
| SBLAK   | FF | 7F | 3F | 1F | 0F | 07 | 03 | 01 |
| EBLAK   | 00 | 80 | C0 | E0 | F0 | F8 | FC | FE |

SBLAK is used to start a black run by setting the bits beyond a white run end to one; EBLAK is used to end a black run by clearing all bits beyond a black run end. It is possible to use the SBLAK table for both purposes, since if all of the low-order bits in a byte are set, subtracting an SBLAK value would have the same effect as ANDing an EBLAK value. However, the EBLAK table is useful in the initializations, and since it does not require very much storage to keep the extra table, our implementation uses both tables. Note that it is possible to eliminate both tables by calculating the SBLAK values when they are needed (via a logical right shift of the value−1 by the appropriate number of bits); this is also a practical approach, particularly if the algorithm is altered so that the unit of image reconstruction (i.e. the size of CUM) is larger than a single byte.

Figure 3:
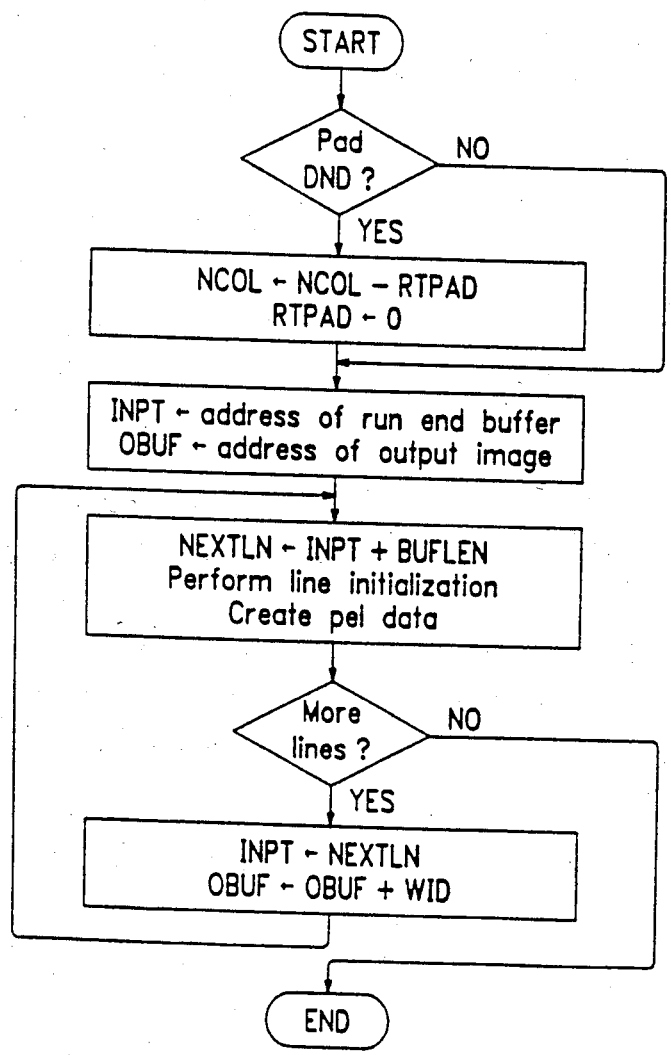
FIG. 3 is a flow chart showing the conversion algorithm according to the present invention.

FIG. 3 shows the basic procedure used to convert one or more lines of run end data. Note that if the padding is DND, then decoding NCOL bits of data with the last RTPAD of those bits being taken from the preexisting output image is equivalent to decoding NCOL-RTPAD bits of data with no right padding; this adjustment can be made before the loop to process lines. Ensuring that RTPAD is zero if the padding is DND simplifies the line initialization by eliminating tests for DND padding on all paths except one.

The pointers to the run end buffer and the output image buffer are set up, and a loop is entered to process the lines one at a time. The address of the next run end buffer is saved, since INPT is modified during processing. Some initializations are performed, and then an inner loop is used to convert the run end data into pels. After that, if there are more lines to be converted, INPT is set to point to the next run end buffer and OBUF is incremented to point to the location where the next line of the output image is to be stored. Control then returns to the top of the loop.

The initialization required before decoding one buffer of run end data is illustrated in FIGS. 4.1, 4.2, 4.3, and 4.4. Referring first to FIG. 4.1, the initialization will be described. First, ENDPT is set to point to the byte beyond the end of the buffer. INPT is incremented to skip over the unit giving the length of the buffer and the three zeroes at the beginning of the buffer. CUM is set to zero. START is then set to contain a bit address such that when a run end is added to START, the result will be the bit address in the output buffer where the run ends. DATEND is set to the bit offset in the line described by the run end buffer where decoding is to stop. The value of RTPAD is later added to DATEND, so that a comparison of a run end with DATEND will indicate whether the end of the line has been reached.

Next, ENDPT is moved so that it points to the first white run end whose succeeding black run end is less than DATEND. To do this, we decrement ENDPT so that ENDPT+2W points to the last white run end. We then determine whether the last black run end (at ENDPT+3W) is greater than or equal so DATEND. If so, we step ENDPT backwards two run ends at a time until it points to a white run end whose succeeding black run end is less than DATEND. Otherwise, the run end buffer represents a line which contains fewer pels than are needed to convert the image as requested. We therefore reset DATEND and RTPAD to convert all available runs and then fill in the additional space with pad bits of whatever color was specified for padding. If the pad color is DND, we decrement NCOL by the number of additional pad bits and reset RTPAD to zero, just as we did before the loop to process the lines began. (If it is possible to have lines of varying lengths in the run end buffers to be converted, it is advisable to restore the values of NCOL and RTPAD to what they were before the loop was entered before processing additional lines; otherwise no converted line can contain more information than the shortest line previously converted.) Note that at this point ENDPT points to the first white run end whose succeeding black run end is less than DATEND.

We are now ready to clear storage in the output image for the converted data, and to modify the run end data so that the loop to convert the run ends will terminate correctly. This is done differently for the three cases where RTPAD is zero (which is always true for DND padding), the padding is white, or the padding is black. FIG. 4.2 shows the processing required for the first case, FIG. 4.3 for the other two cases. Following this step is some additional processing described in FIG. 4.4.

In all cases we will save three run end values, to be restored after the inner loop is executed to reconstruct the pel data. The saving and restoring of run end data is not necessary for the algorithm; if the calling function does not care if the run end data are modified, saving and restoring the data may be omitted.

Note that at this point ENDPT points to the first white run end whose succeeding black run end is less than DATEND. The first two run ends indicated by ENDPT will therefore not be altered. The white run end at ENDPT+2W may or may not be less than DATEND; the black run end at ENDPT+3W must be greater than or equal to DATEND.

FIG. 4.2 shows the steps required when there is no right padding. We first save the three run ends beginning at ENDPT+2W. Next we determine whether the black run at ENDPT+3W is greater than DATEND. If so, the run end is reset to DATEND (i.e. the image line described by the run end buffer is truncated) and the preceding white run is tested against DATEND and reset to DATEND if it is greater. This completes the necessary modification of the input data.

Slightly different procedures are required to set up the output buffer depending on whether the padding is DND or not. If not, then we must zero the number of bits indicated by NCOL beginning at the first bit of the byte pointed to by OBUF. This is done by zeroing as many whole bytes as necessary and then reading in the next byte (which contains the bit following the last bit to be cleared) and masking out as many bits as necessary. This modified byte is stored both in its original location and in a save area for use after the line has been converted.

For DND padding, only NCOL-(LFTPAD+RTPAD) bits must be cleared, since the padding bits must be left intact. The first byte as well as the last byte containing bits to be cleared may contain bits which must be preserved. We begin by addressing the byte containing the first bit to be cleared. This byte is read into CUM, and the required number of low-order bits are cleared. CUM will be stored back into the output image at the beginning of the first iteration of the inner loop. We then address the byte containing the bit beyond the last bit to be cleared. If it is the same byte that was read into CUM (i.e. we have a very short line of real data to convert), we read in the original byte, clear the necessary number of high-order bits, and perform a logical OR of the byte with CUM (without altering CUM). The resulting byte has the middle bits (where the converted data is to be inserted) clear and the high and low-order bits intact. This byte is stored into its original place in the output image and into the save area.

If the first bit to be cleared and the first bit beyond the end of the bits to be cleared are in different bytes, we mask out the required number of high-order bits in the second byte, storing the result into the output image and into the save area. We then zero any bytes between the two bytes already modified.

FIG. 4.3 shows the steps required to clear storage and modify the run end buffer for white or black padding. In either case, we must zero the number of bits indicated by NCOL beginning at the first bit of the byte pointed to by OBUF. As for the case when RTPAD=0 and the padding is not DND, this is done by zeroing as many whole bytes as necessary and then reading in the next byte (which contains the bit following the last bit to be cleared) and masking out as many bits as necessary. The modified byte is then stored both in its original location and in the save area.

For white padding, we must determine whether the white run end at ENDPT+2W is less than DATEND. If it is, then the run endbuffer represents a line which ends with a black run. We increment ENDPT by W so that ENDPT+2W will point to the data to be modified, and then save the three run ends beginning at ENDPT+2W. We truncate the black run end which describes the last black run in the line to DATEND (i.e. to the beginning of the padding) and then increment DATEND by RTPAD so that it gives the bit offset in the image line represented by the run end buffer of the right edge of the output line. This new value of DATEND is saved in place of the succeeding white and black run ends.

If the white run end at ENDPT+2W is not less than DATEND, the the line ends with a white run. The three run ends at ENDPT+2W are saved. DATEND is increased by RTPAD and the resulting value replaces the last white run end and the succeeding black run end.

If the padding is black, three run ends beginning at ENDPT+2W are saved. We then test to see whether the white run at ENDPT+2W is greater than DATEND. If so, it is replaced by DATEND (the white run is truncated to the edge of the padding); if not, it is not disturbed. DATEND is then increased by RTPAD. The new value of DATEND replaces the black run end at ENDPT+3W.

This completes the clearing of the output buffer and the modification of the input buffer for all cases.

FIG. 4.4 illustrates the remaining initialization procedures. First, we determine whether the left edge is to be padded with black. (If the left edge is to be padded with white or DND, the necessary work has already been done.) If so, we fill the required number of complete bytes with X'FF' and load a byte into CUM which has the appropriate number of high-order bits set.

In all cases, LAST (the pointer to the byte in the output image where CUM is to be stored) is set to point to the byte containing the first bit following the left pad.

We next skip over any unwanted data in the run end buffer. As long as the first black run end examined is less than the number of pels to be skipped, we can increment INPT to skip a white/black run pair and go on to test the next black run end. When a black run end which is greater than XSKIP is found, the preceding white run end is examined. If it is also greater than XSKIP, we can proceed directly to the top of the inner loop. If the white run end is not greater than XSKIP, then the converted image data begins with a black run. All of the bits beyond the end of the left pad are set to one, and control passes to the section of the inner loop which processes a black run.

FIG. 4.5 illustrates the inner loop in the conversion process, which handles one white run and the succeeding black run. CUM is first stored in the proper place in the output image. The byte which contains the first bit of the black run following the white run being converted (which may be the same byte) is then read from its place in the output image, and the number of bits in the white run being converted which must appear in that byte is used to index into a lookup table. The result of the table lookup is added to CUM, setting all bits beyond the end of the white run to black. (The storage of CUM on entry to the loop may be omitted if the byte to be read comes from the same address at which CUM is stored, but testing for this case and performing the branch saves very little time if the branch is taken and loses the time required for the test in the more common case where the test fails.)

To process the succeeding black run, we first determine whether that run ends within the byte currently being constructed. If so, we use the number of bits which come before the end of the black run in the byte to index into a lookup table and obtain a mask which clears all of the bits beyond the end of the run. We then test for the end of the line by comparing the black run end with DATEND. If the end of the line has been reached, we leave the loop; otherwise we repeat to process another white run.

If the black run does not end within the current byte, we store the current byte in its proper place in the output image, fill as many bytes with ones as necessary to get to the byte which contains the first bit beyond the end of the run, and use the lookup table from which the mask was obtained in the other case to get a byte with the required number of bits to get to the run end set to one and the remainder of the bits zeroed. We then test for the end of the line, leaving the loop if it has been reached or repeating the loop if it has not.

After leaving the inner loop, we replace the byte containing the first bit beyond the end of the reconstructed image line by the logical OR of the value of that byte saved before the inner loop with the byte currently being reconstructed. The three saved run end values are restored to the run end buffer beginning at ENDPT+2W.

Many variations on the basic conversion algorithm are possible. The processing may be simplified by requiring that some combination of the variables XSKIP, LFTPAD, and RTPAD are zero (for example, if XSKIP is zero then the loop to skip run end data at the beginning of a line could be omitted), or by eliminating the option of DND padding. The precise format of the input run end buffer supplied affects some of the details of the implementation. Many of the operations outside of the inner loop are controlled by the assumptions made about the format of the input run end buffer and the output data required. The inner loop is relatively independent of these considerations; the major variations within this loop would be the use of a different size unit of image data in place of CUM and/or the use of a different procedure to reassemble the image data (i.e. a shift procedure instead of a table lookup).

Features of this method include the following: By zeroing the output lines before processing begins, we avoid having to clear bytes in long white runs during the processing of those runs. Since a typical image contains large regions of all white pels, and since on most processors it is most efficient to clear large areas of storage, we reduce the complexity of processing a white run within the loop and clear the storage more efficiently by zeroing the lines before entering the loop.

By adjusting the input data describing the end of the line, we eliminate the need for special tests during the processing of each run to see whether the run end extends beyond the end of the image line we are reconstructing, or whether we have run out of data. Elimination of these tests simplifies processing of the runs and allows the code to execute more rapidly.

By adjusting the input data so that there will be a black run end at the end of every line, we eliminate the test for the end of the line for all white runs (i.e. half of the time). This reduces the amount of testing required, resulting in fast code.

By processing runs in pairs, we know at any point in the processing what color run we are working on. We can take advantage of that information in processing long white runs, by omitting any processing for white bytes (since the output image has been cleared). Having separate paths for white and black runs also makes it convenient to test for the end of a line for only one color.

By appropriate initializations, the input image can be trimmed and/or padded during the conversion using this algorithm. It is possible to pad using previously existing data in the output image if desired, so that an image whose lines do not begin and end on byte boundaries may be inserted into a larger image without destroying data around the inserted image. This is done by ORing the edge bytes of the reconstructed image with the previously existing data.

Table lookup of the black bits to be added to or removed from a byte of image data being reconstructed allows fast calculation of the reconstructed image. (An alternate procedure for generating the black bits, using shifts of the hexadecimal value FFFFFFFF, may be as fast or faster on some machines.) For long black runs, it is convenient to take advantage of the instructions available on many processors which fill a field of contiguous bytes rapidly. These factors are helpful in obtaining fast code.

PROGRAM EMBODIMENT OF THE PRESENT INVENTION

This function creates an image from runends. For each line, the runend buffer contains a series of halfwords: the number of bytes of data (two bytes for the count and two bytes for each runend), three zeroes, a number of pairs of white/black runends, and two additional copies of the last black runend.

The program embodying the present invention requires an area of storage to contain its variables. These variables are as follows:

Variables in procedure storage

| name | type | offset from beginning of storage |
|---|---|---|
| rlbuf | PTR(31) | 0 |
| obuf | PTR(31) | 4 |
| obufw | FIXED(32) | 4 |
| nlines | FIXED(32) | 8 |
| owid | FIXED(32) | 12 |
| xskip | FIXED(32) | 16 |
| xskiph | FIXED(16) | 18 |
| ncol | FIXED(32) | 20 |
| lftpad | FIXED(32) | 24 |
| rtpad | FIXED(32) | 28 |
| padclrw | FIXED(32) | 32 |
| padclr | FIXED(8) | 35 |
| lftmargin | FIXED(32) | 36 |
| nextln | PTR(31) | 40 |
| last | PTR(31) | 44 |
| lastw | FIXED(32) | 44 |
| svend | FIXED(32) | 48 |
| rtpadr | FIXED(32) | 52 |
| start | FIXED(32) | 56 |
| datend | FIXED(32) | 60 |
| datendh | FIXED(16) | 62 |
| rend | FIXED(32) | 64 |
| rendh | FIXED(16) | 66 |
| lpmxsk | FIXED(32) | 68 |
| m8lftmargin | FIXED(32) | 72 |
| startbytes | FIXED(32) | 76 |
| t | FIXED(32) | 80 |
| th | FIXED(16) | 82 |
| sv(3) | FIXED(16),indexed | 84 |
| cum | FIXED(8) | 90 |
| svb | FIXED(8) | 91 |
| startmask | FIXED(8) | 92 |
| sblacks(8) | FIXED(8),indexed | 93 |
| eblacks(8) | FIXED(8),indexed | 101 |

Variables based on the pointer "b0"

| name | type | offset from b0 |
|---|---|---|
| whiteend | FIXED(16) | 0 |
| buflen | FIXED(16) | 0 |
| blackend | FIXED(16) | 2 |

Variable based on the pointer "b1"

| name | type | offset from b1 |
|---|---|---|
| runends(N) | FIXED(16), indexed | 0 |

Variable based on the pointer "last"

| name | type | offset from last |
|---|---|---|
| lastbyte | FIXED(8) | 0 |

The lookup tables "sblacks" and "eblacks" are initialized with the following hexadecimal values:

| sblacks: | FF | 7F | 3F | 1F | 0F | 07 | 03 | 01 |
| eblacks: | 00 | 80 | C0 | E0 | F0 | F8 | FC | FE |

Since the language in which this program is written employs forward Polish notation, an end-of-statement symbol (such as the ";" in PL/I) is unnecessary in most cases.

All array indices are expressed as offsets in bytes from the beginning of the array.

The following subroutines are assumed to be available:

```
copy(DEST,SOURCE,N)     copies N bytes from source to DEST
fill(DEST,BYTE,N)       fill N bytes of storage beginning at
                        DEST with the value BYTE procedure fromruns(argpt);
call copy(addr rlbuf,argpt,40)
b0=rlbuf
lpmxsk= -lftpad xskip
obuf= +obuf srl lftmargin 3
lftmargin=and lftmargin 7
t=lftmargin
if padclr=0
   t= +t lftpad
end
startbytes=srl t 3
startmask=sblacks(and t 7)
m8lftmargin= -8 lftmargin
begin
b1= +b0 buflen
nextln=b1
b0= +b0 8
start= + +(sll obufw 3) lftmargin lpmxsk
rtpadr=rtpad
datend= - -ncol lpmxsk rtpadr
b1= -b1 12
t=0
th=runends(6)
if datend>t
   rtpadr= +rtpadr -datend t
   datend=t
else
begin
if expa runends(2)  <datend
   b1= -b1 4
   repeat
end
end
end
t= -ncol m8lftmargin
last=obuf
if t  <0
lastbyte=and lastbyte eblacks(lftmargin)
last= +last 1
call fill(last,0,srl t 3)
last= +last (srl t 3)
lastbyte=and lastbyte sblacks(and t 7)
else
lastbyte=and lastbyte eor_ 1
(and (sblacks(lftmargin)) (eblacks(+lftmargin ncol)))
end
svb=lastbyte
begin
if rtpadr=0
call copy(addr sv,+b1 4,6)
runends(6)=expl datend
if runends(4)>datendh
   runends(4)=datendh
end
leave
end
if padclr=0
if runends(4)  <datendh
call copy(addr sv,+b1 4,6)
datend= +datend rtpadr
runends(4)=datendh
runends(6)=datendh
else
b1= +b1 2
call copy(addr sv,+b1 4,6)
runends(4)=datendh
datend= +datend rtpadr
runends(6)=datendh
runends(8)=datendh
end
leave
end
call copy(addr sv,+b1 4,6)
if runends(4)>datendh
   runends(4)=datendh
end
datend= +datend rtpadr
runends(6)=datendh
end
begin
if blackend<xskiph
   b0= +b0 4
   repeat
end
end
last= +obuf startbytes
cum=lastbyte
if whiteend  >xskiph
   cum=or cum startmask
   rend=0
   rendh=blackend
   b0= +b0 4
   goto startblack
else
if padclr  =0
   cum=or cum startmask
   rend=xskip
   goto startblack
end
end
begin
lastbyte=cum
rend=0
rendh=whiteend
rend= +rend start
lastw=srl rend 3
cum=or lastbyte sblacks(and rend 7)
rend=0
rendh=blackend
b0= +b0 4
label startblack
svend=rend
rend= +rend start
t=srl rend 3
if t=lastw
cum=and cum eblacks(and rend 7)
else
lastbyte=cum
last= +last 1
t= -t lastw
if t  =0
call fill(last,255,t)
last= +last t
end
cum=eblacks(and rend 7)
end
if svend  <datend
leave
else
repeat
end
end
lastbyte=or cum svb
call copy(+b1 4,addr sv,6)
nlines= -nlines 1
if nlines>0
   b0=nextln
   obuf= +obuf owid
   repeat
end
end
end
```

Thus, while the invention has been described with reference to preferred embodiments thereof, it will be understood by those skilled in the art that various changes in form and details may be made without departing from the scope of the invention.

What is claimed is:

1. A method for converting data representing a binary image from run representation form to bit map form, comprising the steps of:
   initializing to a first binary value all of the bits in an output area where the bit map is to be formed;
   storing data comprising a plurality of pairs of run representations of said image in a buffer, each of said pairs defining the beginning and the end of a run of image bits of a second binary value;

converting each of said pairs of run representations stored in said buffer successively to strings of image bits of said second binary value; and transferring said strings of image bits of said second binary value to said output area into positions offset in accordance with the respective beginning positions of said strings as indicated by said run representations, such that said image data is converted to a bit map representation in said output area without the need for creating and transferring strings of image bits of said first binary value.

2. A method according to claim 1 wherein said step of converting comprises selecting by table lookup bit string representations for said run representations.

3. A method according to claim 1, further comprising the step of:
assigning first and second address pointers to locate run representation data and bit string data during said transfer step.

4. A method according to claim 1 wherein said data further comprises a plurality of representations of lines of image data.

5. A method according to claim 1 wherein said output area is composed of bytes and said bytes are arranged in lines.

6. A method according to claim 5 wherein said step of initializing further comprises adding padding bits to at least one end of each of said lines in accordance with a preselected pattern.

7. A method according to claim 5 wherein said lines begin and end on byte boundaries.

8. A method according to claim 5 wherein said lines are arranged sequentially.

9. A method according to claim 5 further comprising omitting at least portions of certain of said strings of image bits which lie outside of a selected region within said output area.

10. A method according to claim 1 wherein said run representations comprise run ends.

11. A method according to claim 1 wherein said run representations comprise run lengths.

12. A method according to claim 1 wherein said data further comprises a representation of the length of said data in said buffer.

13. A method according to claim 1 wherein said data further comprises three zero run representations.

14. A method according to claim 1 wherein said data further comprises a copy of the last run representation at the end of said buffer.

15. A method according to claim 1 wherein said run representation pairs each comprise a first representation of a sequence of bits of said first bit value and a second representation of a sequence of bits of said second bit value.

16. Apparatus for converting data representing a binary image from run representation form to bit map form, comprising:
output area means comprising a plurality of bits for storing said bit map;
means for initializing to a first binary value all of said bits in said output area means;
buffer means for storing data comprising a plurality of pairs of run representations of an image, each of said pairs defining the beginning and the end of a run of image bits of a second binary value;
means for converting successive pairs of run representations stored in said buffer means to strings of image bits of said second binary value; and
means for transferring said strings of image bits of said second binary value to said output area means into positions offset in accordance with the respective beginning positions of said strings as indicated by said run representations, such that said image data is converted to a bit map representation in said output area means without the need for creating and transferring strings of image bits of said first binary value.

17. Apparatus according to claim 16 wherein said means for converting further comprises table lookup means for selecting bit string representations for said run representations.

18. Apparatus according to claim 16 wherein said output area means is divided into bytes and said bytes are arranged in lines with said lines beginning and ending on byte boundaries; and said means for initializing further comprises means for assigning bit values to padding bits on at least one end of each of said lines in accordance with a preselected pattern.

19. Apparatus according to claim 16 further comprising means for assigning first and second address pointers to locate run representation data and bit string data during transfer.

20. Apparatus according to claim 16 further comprising means for omitting at least portions of certain of said strings of image bits which lie outside of a selected region within said output area.

* * * * *